United States Patent
Chen et al.

(10) Patent No.: US 12,255,437 B2
(45) Date of Patent: Mar. 18, 2025

(54) LASER EMITTING CIRCUIT AND LIDAR

(71) Applicant: SUTENG INNOVATION TECHNOLOGY CO., LTD., Shenzhen (CN)

(72) Inventors: Junlin Chen, Shenzhen (CN); Wenbin Rui, Shenzhen (CN)

(73) Assignee: SUTENG INNOVATION TECHNOLOGY CO., LTD., Shenzhen (CN)

(*) Notice: Subject to any disclaimer, the term of this patent is extended or adjusted under 35 U.S.C. 154(b) by 119 days.

(21) Appl. No.: 17/721,319

(22) Filed: Apr. 14, 2022

(65) Prior Publication Data
US 2022/0239063 A1  Jul. 28, 2022

Related U.S. Application Data

(63) Continuation of application No. PCT/CN2020/079374, filed on Mar. 13, 2020.

(30) Foreign Application Priority Data

Oct. 17, 2019  (WO) ................ PCT/CN2019/111738
Dec. 20, 2019  (WO) ................ PCT/CN2019/127055

(51) Int. Cl.
*H01S 5/042* (2006.01)
*G01S 7/484* (2006.01)
(Continued)

(52) U.S. Cl.
CPC ............ *H01S 5/0428* (2013.01); *G01S 7/484* (2013.01); *G01S 17/10* (2013.01); *H02J 7/345* (2013.01); *H02J 2207/50* (2020.01)

(58) Field of Classification Search
None
See application file for complete search history.

(56) References Cited

U.S. PATENT DOCUMENTS 5,736,881 A * 4/1998 Ortiz .................. H01S 5/042
                                                327/515
6,697,402 B2 * 2/2004 Crawford ............ H01S 5/042
                                                372/38.03
(Continued)

FOREIGN PATENT DOCUMENTS

CN    104660069 A    5/2015
CN    106549301 A    3/2017
(Continued)

OTHER PUBLICATIONS

First Office Action issued in related Chinese Application No. 202080005462.6, mailed Oct. 15, 2021, 29 pages.
(Continued)

*Primary Examiner* — Tod T Van Roy
(74) *Attorney, Agent, or Firm* — BAYES PLLC

(57) ABSTRACT

An embodiment of this application discloses a laser emitting circuit and a LiDAR, and belongs to the field of the LiDAR. The structure of the laser emitting circuit is changed so that for the laser emitting circuit in an energy transfer stage, the energy transfer current from an energy storage element does not pass through a laser diode, and the laser diode is in a reverse-biased state relative to the energy transfer current. Therefore, the parasitic capacitance of an energy releasing switch element does not cause the laser diode to emit light in advance during an energy transfer charging process, which prevents the laser diode from emitting light at an unanticipated time, thereby solving the problem of laser leakage.

7 Claims, 8 Drawing Sheets

(51) Int. Cl.
*G01S 17/10* (2020.01)
*H02J 7/34* (2006.01)

(56) References Cited

U.S. PATENT DOCUMENTS

| | | | |
|---|---|---|---|
| 10,048,358 B2 * | 8/2018 | Berger | G01S 7/497 |
| 10,277,007 B1 * | 4/2019 | Lenius | G01S 17/06 |
| 10,574,026 B2 * | 2/2020 | Mignoli | H01S 5/0428 |
| 10,903,621 B2 * | 1/2021 | Stern | H01S 5/0428 |
| 11,768,276 B2 * | 9/2023 | Chen | H01S 5/0428 |
| | | | 356/73 |
| 2010/0283322 A1 * | 11/2010 | Wibben | H02M 3/158 |
| | | | 307/31 |
| 2014/0211192 A1 * | 7/2014 | Grootjans | H02M 7/42 |
| | | | 356/5.01 |
| 2016/0285383 A1 * | 9/2016 | Pan | H02M 1/4225 |
| 2017/0085057 A1 * | 3/2017 | Barnes | H01S 5/0428 |
| 2018/0188360 A1 * | 7/2018 | Berger | G01S 7/497 |
| 2020/0412087 A1 * | 12/2020 | Shen | G01S 7/484 |
| 2021/0111533 A1 * | 4/2021 | Mousavian | G01S 17/10 |
| 2022/0239063 A1 * | 7/2022 | Chen | H02J 7/345 |
| 2022/0285909 A1 * | 9/2022 | Kimura | H01S 5/0239 |
| 2022/0317251 A1 * | 10/2022 | Chen | G01S 7/484 |
| 2023/0041579 A1 * | 2/2023 | Omelkov | H01S 5/0428 |

FOREIGN PATENT DOCUMENTS

| | | |
|---|---|---|
| CN | 206412630 U | 8/2017 |
| JP | 2016152336 A * | 8/2016 |
| WO | WO-2020142947 A1 * | 7/2020 |
| WO | WO-2022261835 A1 * | 12/2022 |

OTHER PUBLICATIONS

Second Office Action issued in related Chinese Application No. 202080005462.6, mailed May 23, 2022, 16 pages.

* cited by examiner

LASER EMITTING CIRCUIT AND LIDAR

CROSS-REFERENCE TO RELATED APPLICATION

The present application is a continuation of International Application No. PCT/CN2020/079374, filed Mar. 13, 2020, which claims the benefit of International Application No. PCT/CN2019/127055, filed Dec. 20, 2019, and International Application No. PCT/CN2019/111738, filed Oct. 17, 2019, the contents of which are incorporated herein by reference in their entireties.

TECHNICAL FIELD

This application relates to the field of laser circuit, in particular to a laser emitting circuit and a LiDAR.

BACKGROUND

For a LiDAR, a laser emitting circuit is used to emit laser. The working process of the laser emitting circuit is generally divided into three stages: an energy charging stage, an energy transfer stage, and an energy releasing stage. The energy charging stage includes charging one energy storage element and storing electrical energy in the energy storage element. The energy transfer stage includes transferring the electrical energy stored on the energy storage element to an energy transfer element after the energy charging stage is completed. The energy releasing stage includes releasing the electrical energy stored on the energy transfer element to drive a laser diode to emit laser after the transfer of the electrical energy is completed. Currently, with the development of the LiDAR, it is necessary for the LiDAR to complete the energy charging stage in a shorter time. However, the inventor found that in the process of reducing charging time, an original laser emitting circuit emitted laser in advance during the energy transfer stage, causing the phenomenon of "laser leakage," that is, the laser emitting circuit emits light at an unanticipated time, which will affect the measurement performance of the LiDAR.

SUMMARY

A laser emitting circuit and a LiDAR provided in an embodiment of this application can solve the problem of laser leakage in the related art caused by the laser emitting circuit when the laser emitting circuit emits laser in the energy transfer stage. Technical solutions are as follows:

In a first aspect, an embodiment of this application provides a laser emitting circuit, including:

an energy charging circuit, connected to an energy releasing circuit, where the energy charging circuit includes a first energy storage element and is configured to charge the first energy storage element using an energy charging current from a power supply in an energy charging stage;

an energy transfer circuit, connected to the energy charging circuit and the energy releasing circuit, where the energy transfer circuit includes a second energy storage element and is configured to charge the second energy storage element using the energy transfer current from the first energy storage element in an energy transfer stage; where the energy transfer current maintains a reverse-biased state for the laser diode in an energy transfer stage; and the energy releasing circuit, connected to the energy transfer circuit, where the energy releasing circuit includes a laser diode, and is configured to use the energy releasing current from the second energy storage element to drive the laser diode to emit light in an energy releasing stage.

In a second aspect, an embodiment of this application provides a laser emitting circuit, including:

an energy charging circuit, connected to an energy transfer circuit, and configured to store electrical energy;

the energy transfer circuit, connected to the energy charging circuit and an energy releasing circuit, and configured to transfer electrical energy stored in the energy charging circuit to the energy transfer circuit; the energy transfer circuit including an energy storage capacitor and a floating-ground diode, a first terminal of the energy storage capacitor being connected to the energy charging circuit, the first terminal of the energy storage capacitor being connected to a first terminal of an energy releasing switch element, a second terminal of the energy storage capacitor being connected to an anode of the floating-ground diode, the second terminal of the energy storage capacitor being connected to the energy releasing circuit, and a cathode of the floating-ground diode being grounded; and the energy releasing circuit, connected to the energy transfer circuit and configured to use electrical energy stored in the energy transfer circuit to drive a laser diode to emit light; the energy releasing circuit including the energy releasing switch element and the laser diode, the first terminal of the energy releasing switch element being connected to the first terminal of the energy storage capacitor, a second terminal of the energy releasing switch element being grounded, the second terminal of the energy releasing switch element being connected to an anode of the laser diode, and a cathode of the laser diode being connected to the second terminal of the energy storage capacitor;

where the energy releasing circuit further includes a dynamic compensation capacitor, and the dynamic compensation capacitor is connected across two terminals of the energy releasing switch element.

In a third aspect, an embodiment of this application provides a LiDAR, including a forgoing laser emitting circuit. The beneficial effects brought by the technical solutions provided by some embodiments of this application include at least the following:

The structure of the laser emitting circuit is changed so that for the laser emitting circuit in the energy transfer stage, the energy transfer current from the energy storage element does not pass through the laser diode, and the laser diode is in a reverse-biased state relative to the energy transfer current. Therefore, the parasitic capacitance of an energy releasing switch element does not cause the laser diode to emit light in advance during an energy transfer charging process, which prevents the laser diode from emitting light at an unanticipated time, thereby solving the problem of laser leakage.

BRIEF DESCRIPTION OF DRAWINGS

To explain embodiments of this application or the technical solutions in the prior art more clearly, the following briefly introduces the drawings that need to be used in the embodiments or the prior art. Obviously, the drawings in the following description are only some embodiments of this application. The person skilled in the art can obtain other drawings based on these drawings without inventive work.

DETAILED DESCRIPTION

To make the objectives, technical solutions and advantages of this application clearer, the embodiments of this application are described in further detail below with reference to the drawings.

Figure 1:
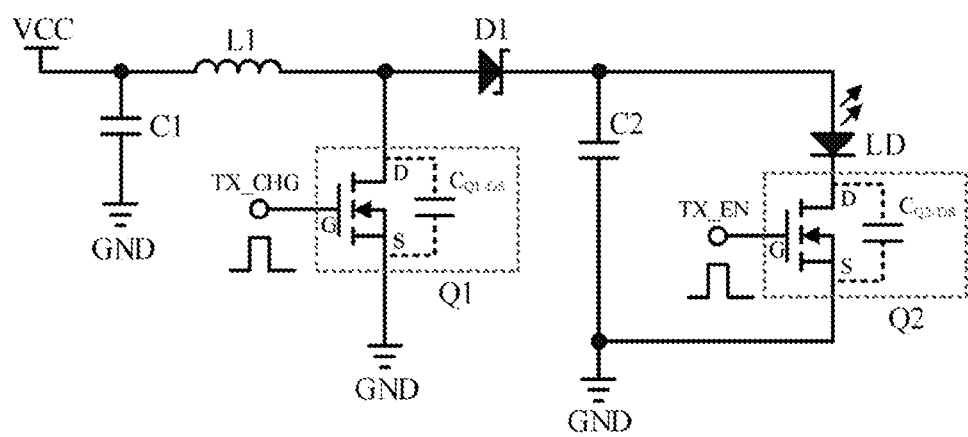
FIG. 1 is a schematic structural diagram of a laser emitting circuit in the prior art provided by an embodiment of this application.

FIG. 1 shows a schematic diagram of a laser emitting circuit in prior art. The working process of the laser emitting circuit is divided into three stages: an energy charging stage, an energy transfer stage, and an energy releasing stage. The three stages are described in detail below.

The energy charging stage: a gate of a switch tube Q1 is connected to a pulse generator TX_CHG. The pulse generator TX_CHG sends rectangular pulses to control the on and off of the switch tube Q1. The pulse generator TX_EN sends rectangular pulses to control the on and off of a switch tube Q2. When the switch tube Q1 is in an on-state and the switch tube Q2 is in an off-state, the laser emitting circuit is in the energy charging stage. The current generated by the power supply VCC flows through an inductor L1 and the switch tube Q1 to form a loop and charge the inductor L1. It is assumed that the on-time of the switch tube Q1 is Δt (Δt is also called energy charging time), and then the current increment in the inductor L1 follows the formula: $\Delta I = (V_{CC} \times \Delta t)/L_1$ (Formula 1).

$V_{CC}$ in Formula 1 represents a voltage of the power supply VCC, and $L_1$ represents an inductance of the inductor L1. Charged energy follows the formula: $W_L = \frac{1}{2} \times L_1 \times \Delta I^2$ (Formula 2).

Formula 1 is substituted into Formula 2 to obtain $$W_L = \frac{1}{2} \times \frac{(Vcc \times \Delta t)^2}{L_1}. \quad \text{(Formula 3)}$$

According to Formula 3, it can be seen that the charged energy $W_L$ is inversely proportional to the inductance L1, and is proportional to the square of the on-time Δt of the switch tube Q1. When keeping the charged energy $W_L$ unchanged, to reduce the on-time of the switch tube Q1, the inductance of the inductor L1 needs to be reduced.

It can be seen from Formula 1 and Formula 2 that the pulse generator TX_CHG can control the width of the rectangular pulses to control the on-time of the switch tube Q1, that is, the energy charging time of the inductor L1 is controlled, thereby changing the size of the charged energy and adjusting the emission power of the laser.

The energy transfer stage: when the switch tube Q1 is in an off-state and the switch tube Q2 is also in the off-state, the laser emitting circuit is in the energy transfer stage. Because the current of the inductor L1 cannot change suddenly, the charged electrical energy is stored in the inductor L1. The inductor L1 charges an energy storage element C2 via a boost rectifier diode D1 so that the charged electrical energy stored in the inductor L1 can be transferred to the energy storage element C2.

Although the switch tube Q1 and the switch tube Q2 are in the off-state, parasitic capacitance is provided between drains and sources of the two switch tubes. The parasitic capacitance between the drain and the source of the switch tube Q1 is denoted as $C_{Q1\text{-}DS}$. The parasitic capacitance between the drain and the source of the switch Q2 is denoted as $C_{Q2\text{-}DS}$.

Then the current increment ΔI of the inductor L1 is diverted via the following three branches:

Loop 1: current flows from the inductor L1 through the parasitic capacitance $C_{Q1\text{-}DS}$ to the ground GND to form a loop. The current in this loop is defined as $I_{CQ1}$.

Loop 2: current flows from the inductor L1 through the boost rectifier diode D1 and the energy storage element C2 to the ground GND to form a loop. The current in this loop is defined as $I_{C2}$.

Loop 3: current flows from L1 through the boost rectifier diode D1, a laser diode LD, and $C_{Q2\text{-}DS}$ to the ground GND to form a loop. The current is defined as Tow.

Only Loop 2 of the above three loops is the main energy charging loop, which realizes the energy storage function of the energy storage element C2. Loop 1 and Loop 3 are both caused by the parasitic capacitance.

Given that the forward voltage drops of the boost rectifier diode D1 and the laser diode LD are relatively small, which has relatively small influence on each loop, the influence of the boost rectifier diode D1 and the laser diode LD on the voltage drop of the loop is ignored to simplify calculation, $\Delta I = I_{C2} + I_{CQ1} + I_{CQ2}$ (Formula 4) is obtained.

It is assumed that $C_{Q1\text{-}DS} = C_{Q2\text{-}DS} = C_2/N$ is provided, where N is a number greater than 0; $C_{Q1\text{-}DS}$ represents the value of the parasitic capacitance of the switch tube $Q_1$; $C_{Q2\text{-}DS}$ represents the value of the parasitic capacitance of the switch tube $Q_2$; and $C_2$ represents the value of the energy storage element C2. The values of current flowing through each loop are as follows:

$$I_{C2} = \frac{N}{N+2} \times \Delta I; \quad \text{(Formula 5)}$$

$$I_{CQ1} = \frac{1}{N+2} \times \Delta I; \text{ and} \quad \text{(Formula 6)}$$

$$I_{CQ2} = \frac{1}{N+2} \times \Delta I. \quad \text{(Formula 7)}$$

According to Loop 3, it can be seen that $I_{CQ2}$ is equal to the current ILD of the laser diode LD, that is, $I_{CQ2} = I_{LD}$ (Formula 8). A current threshold of the laser diode LD to emit light is set as $I_{LD\text{-}TH}$. If $I_{CQ2}$ is greater than the current threshold $I_{LD\text{-}TH}$, the laser diode LD emits laser in the energy transfer stage, causing light leakage, that is, the laser emitting circuit emits light at an unanticipated time, thereby affecting the measurement performance of LiDAR.

For example, to achieve comprehensive performance of the LiDAR, such as, improving a frequency point of a system, realizing dual emission or multiple emission, and other functions, it is required to reduce the energy charging time Δt.

Under the premise of keeping the energy $W_L$ of the inductor L1 and the voltage of the power supply VCC unchanged, according to Formula 3, it can be seen that the inductance of the inductor L1 in an energy charging circuit needs to be reduced accordingly. Then, according to Formula 1, it can be seen that if the inductance of the inductor L1 decreases, the charging current ΔI generated by the inductor L1 increases accordingly. Finally, according to Formula 7 and Formula 8, it can be seen that when the charging current ΔI increases, the current flowing through the laser diode LD during an energy transfer process also increases, so that the current flowing through the laser diode LD may meet the conditions of $I_{CQ2}=I_{LD} \geq I_{LD-TH}$. At this time, the laser diode LD emits light at an unanticipated time, causing the phenomenon of "laser leakage."

The energy releasing stage: when the switch tube Q1 is in an off-state and the switch tube Q2 is in an on-state, the laser emitting circuit is in the energy releasing stage. The energy stored on the energy storage element C2 passes through the laser diode LD and the switch tube Q2 to the ground GND to form a loop and drive the laser diode LD to emit laser, thereby making the laser diode LD emit laser at an anticipated time.

Figure 2:
FIG. 2 is a block diagram of a laser emitting circuit provided by an embodiment of this application.

To solve the above technical problems, an embodiment of this application provides a laser emitting circuit. As shown in FIG. 2, the laser emitting circuit of the embodiment of this application includes an energy charging circuit 201, an energy transfer circuit 202, and an energy releasing circuit 203.

The energy charging circuit 201 is connected to the energy transfer circuit 202. The energy charging circuit 201 includes a first energy storage element for storing electrical energy. The first energy storage element may be a capacitor or an inductor, or may include both the capacitor and the inductor. The energy charging circuit 201 charges the first energy storage element using the energy charging current from the power supply in the energy charging stage.

The energy transfer circuit 202 is connected to the energy charging circuit 201 and the energy releasing circuit 203. The energy transfer circuit 202 includes a second energy storage element. The energy transfer circuit 202 charges the second energy storage element using the energy transfer current from the first energy storage element in the energy transfer stage. In the energy transfer stage, the energy transfer current maintains a reverse-biased state for the laser diode, so that a laser diode does not emit light in the entire energy transfer stage. The second energy storage element is configured to store electrical energy. The second energy storage element can be a capacitor or an inductor, or can include both the capacitor and the inductor. The energy releasing circuit 203 includes the forgoing laser diode and is configured to use the energy releasing current from the second energy storage element to drive the laser diode to emit light in the energy releasing stage. The energy releasing stage is the normal light-emitting time of the laser diode.

In an embodiment of this application, the structure of the laser emitting circuit is changed so that for the laser emitting circuit in the energy transfer stage, the energy transfer current from the energy storage element does not pass through the laser diode, and the laser diode is in a reverse-biased state relative to the energy transfer current. Therefore, the parasitic capacitance of an energy releasing switch element does not cause the laser diode to emit light in advance during an energy transfer charging process, which prevents the laser diode from emitting light at an unanticipated time, thereby solving the problem of laser leakage.

In some embodiments of this application, one or a plurality of energy transfer circuits 202 may be provided, and one or a plurality of energy releasing circuits 203 may also be provided. When a plurality of energy transfer circuits 202 is provided, a plurality of the energy releasing circuits 203 may be provided correspondingly, that is, the energy transfer circuit 202 and the energy releasing circuit 203 have a one-to-one mapping relationship. When one energy transfer circuit 202 is provided, a plurality of the energy releasing circuits 203 can be provided, that is, the energy transfer circuit 202 and the energy releasing circuit 203 have a one-to-multiple relationship.

Figure 3:
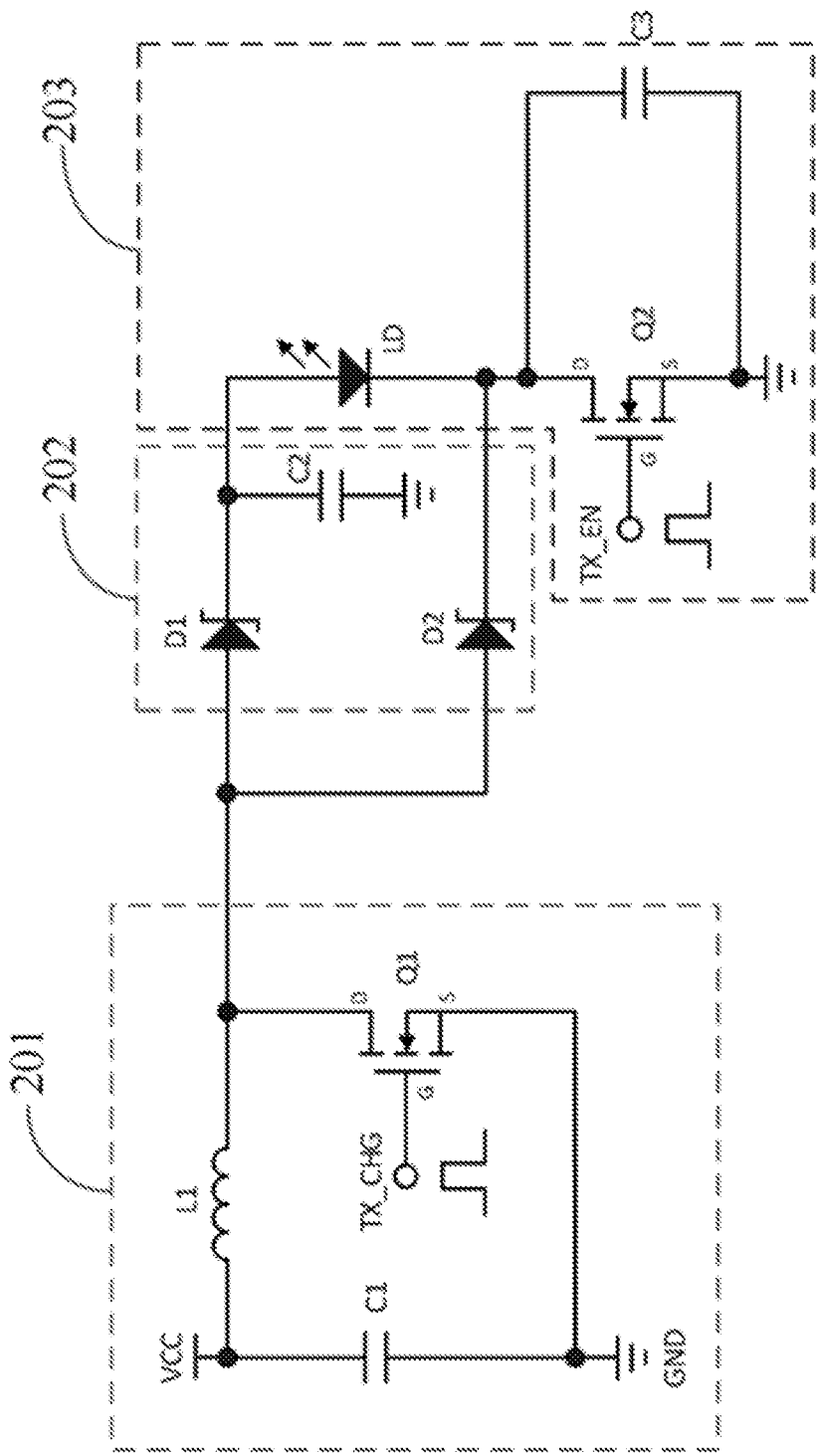
FIG. 3 is a schematic structural diagram of a laser emitting circuit provided by an embodiment of this application.

Referring to FIG. 3, an embodiment of this application provides a schematic diagram of a laser emitting circuit. In some embodiments of this application, the energy charging circuit 201 includes a power supply VCC, an inductor L1, an energy charging switch element Q1, and a decoupling capacitor C1, where a first energy storage element is the inductor L1. The power supply VCC can be a DC power supply. A positive terminal of the power supply VCC is grounded via the decoupling capacitor C1, and the negative terminal of the power supply VCC is grounded. A first terminal of the inductor L1 is connected to the positive terminal of the power supply VCC. A second terminal of the inductor L1 is connected to a first terminal of the energy charging switch element Q1. The second terminal of the inductor L1 is connected to the energy transfer circuit 202. A second terminal of the energy charging switch element Q1 is grounded. The energy charging switch element Q1 can be a transistor or a metal-oxide-semiconductor (MOS) tube. For example, the transistor can be a PNP transistor or an NPN transistor, and the MOS tube can be an NMOS tube, a PMOS tube, or a GaN (Gallium Nitride) switch tube.

In some embodiments of this application, an energy releasing circuit 203 includes an energy releasing switch element Q2 and a laser diode LD. An anode of the laser diode LD is connected to the energy transfer circuit 202, and a cathode of the laser diode LD is connected to the first terminal of energy releasing switch element Q2. A second terminal of the energy releasing switch element Q2 is grounded. The energy releasing switch element Q2 can be the transistor or the MOS tube. For example, the transistor can be the PNP transistor or the NPN transistor, and the MOS tube can be the NMOS tube, the PMOS tube, or the GaN switch tube.

Optionally, the energy releasing circuit 203 further includes a dynamic compensation capacitor C3. The dynamic compensation capacitor C3 is connected across the first terminal and the second terminal of the energy releasing switch element Q2.

In some embodiments of this application, the energy transfer circuit 202 includes a capacitor C2 and a bypass diode D2. A second energy storage element is the capacitor C2. A first terminal of the capacitor C2 is connected to the first terminal of the inductor L1. A second terminal of the capacitor C2 is grounded. An anode of the bypass diode D2 is connected to the second terminal of the inductor L1, and a cathode of the bypass diode D2 is connected to the first terminal of the energy releasing switch element Q2.

Optionally, the energy transfer circuit 202 further includes a boost rectifier diode D1. An anode of the boost rectifier diode D1 is connected to the second terminal of the inductor L1, and a cathode of the boost rectifier diode D1 is connected to the first terminal of the capacitor C2. The boost rectifier diode D1 has a one-way conduction function, which prevents the capacitor C2 from reversely discharging electricity in the energy transfer stage and the energy releasing stage, causing the electrical energy in the capacitor C2 to flow back and causing the electrical energy in the capacitor C2 to leak. It can be understood that the boost rectifier diode D1 may be a Schottky diode.

Taking both the energy charging switch element Q1 and the energy releasing switch element Q2 as the MOS tubes as an example, a working process of the laser emitting circuit is explained.

1. The Energy Charging Stage

A pulse generator TX_CHG sends rectangular pulses to a gate of the MOS tube Q1 to control the MOS tube.

Q1 is in an on-state, and the MOS tube Q2 is in an off-state at this time. The power supply VCC charges the inductor L1. The decoupling capacitor C1 is connected in parallel between the positive terminal and the negative terminal of the power supply VCC to be able to prevent the circuit from causing parasitic oscillation via a positive feedback path formed by the power supply VCC.

2. The Energy Transfer Stage

After energy charging is completed, the pulse generator TX_CHG stops sending the rectangular pulses to the MOS tube Q1. The MOS tube Q1 is in an off-state, and the MOS tube Q2 is still in the off-state. Because the current of the inductor L1 cannot change suddenly, the inductor L1 continues the energy transfer current generated by ΔI, and the energy transfer current is divided into two paths. One path of the energy transfer current flows through the boost rectifier diode D1 and the capacitor C2 to the ground to form a loop in which the energy charging current charges the energy storage element C2. The laser diode LD is in a reverse-biased state due to the bypass diode D2. Therefore, the laser diode LD does not emit light. The other path of the energy charging current flows through the bypass diode D2 and the parasitic capacitance $C_{Q2\text{-}DS}$ (not shown in the figure) of the MOS tube Q2 to the ground to form another loop in which the energy charging current does not flow through the laser diode LD. Therefore, the laser diode LD does not emit light.

Obviously, neither of the forgoing two paths of energy transfer currents flows through the laser diode LD, and hence the laser diode LD does not emit light at an unanticipated time, thereby solving the problem of laser leakage.

3. The Energy Releasing Stage

The pulse generator TX_EN sends the rectangular pulses to the gate of the MOS tube Q2 to control the MOS tube Q2 to be in an on-state. The MOS tube Q1 is in the off-state at this time. The electrical energy stored in the capacitor C2 flows through the laser diode LD and a drain and a source of the MOS tube Q2 to form an energy releasing (electric discharge) loop, and drive the laser diode LD to complete the laser emission. In addition, the dynamic compensation capacitor C3 also forms its electric discharge loop via the drain and the source of the MOS tube Q2, and releases the electrical energy stored during the energy transfer to prepare for the next cycle of laser emission.

Figure 4A:
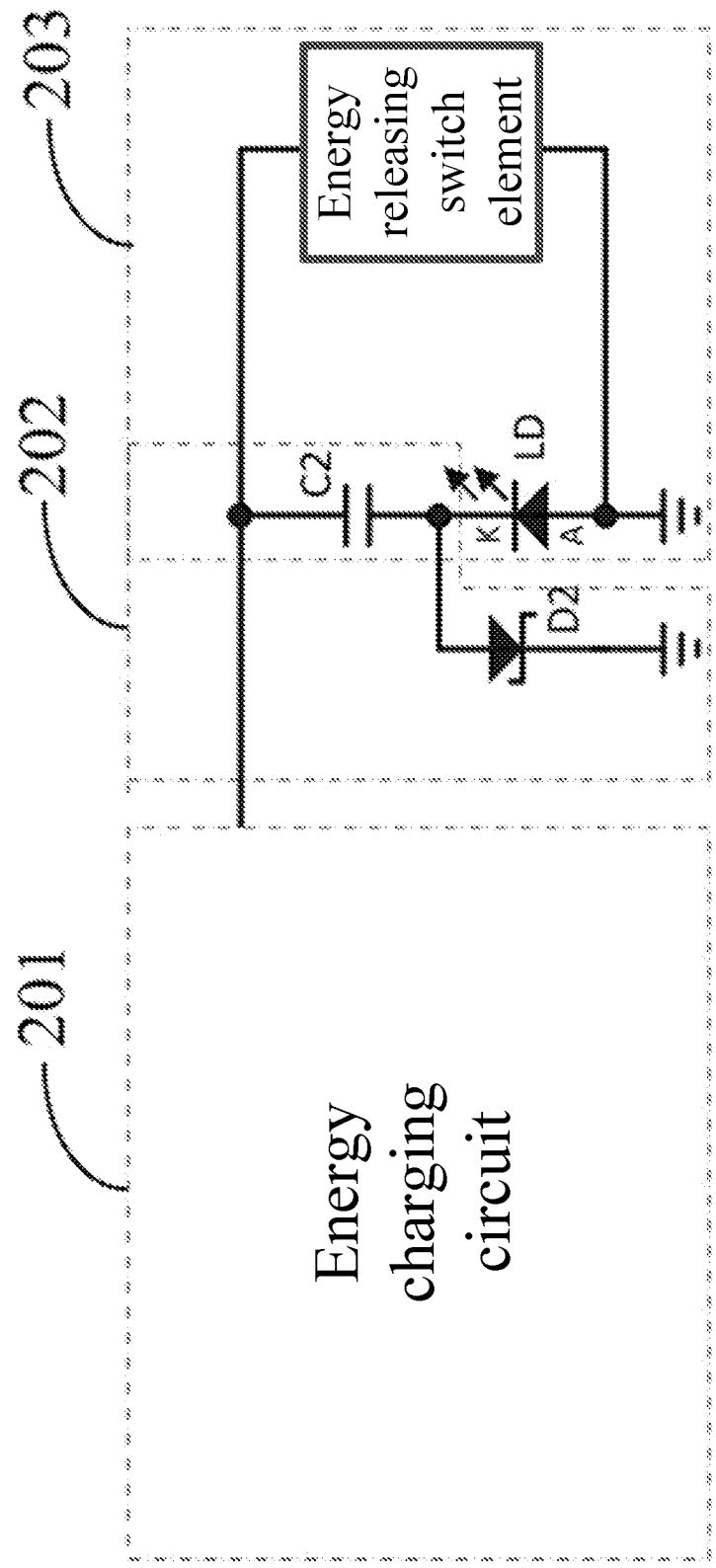
FIG. 4a is another schematic structural diagram of an energy transfer circuit and an energy releasing circuit provided by an embodiment of the present application.

FIG. 4a is another schematic structural diagram of an energy transfer circuit and an energy releasing circuit provided by an embodiment of the present application. An energy transfer circuit 202 includes an energy storage capacitor C2 and a floating-ground diode D2. An energy releasing circuit 203 includes the energy storage capacitor C2, an energy releasing switch element, and a laser diode LD. The energy releasing switch element includes two switch terminals and a control terminal (not shown in FIG. 4a). The control terminal is input with a control signal (such as a pulse signal) to control the on or off of the two switch terminals, thereby realizing the on-state or off-state of the energy releasing switch element. The energy releasing switch element can be a GaN switch tube, a MOSFET (Metal-Oxide-Semiconductor Field-Effect Transistor), or an IGBT (Insulated Gate Bipolar Transistor).

A connection relationship between various elements in the energy transfer circuit 202 and the energy releasing circuit 203 is as follows: a first terminal of the energy storage capacitor C2 is connected to the energy charging circuit 201. The first terminal of the energy storage capacitor C2 is connected to a first terminal of an energy releasing switch element. A second terminal of the energy storage capacitor C2 is connected to an anode of a floating-ground diode D2. The second terminal of the energy storage capacitor C2 is connected to a cathode (K) of the laser diode LD. A cathode of the floating-ground diode D2 is grounded. An anode (A) of the laser diode LD is grounded, and the anode of the laser diode LD is connected to a second terminal of the energy releasing switch element. The first terminal and the second terminal of the energy releasing switch element in this embodiment refer to two switch terminals of the energy releasing switch element.

The working process of the laser emitting circuit in FIG. 4a includes:

In an energy charging stage, an energy storage element in the energy charging circuit 201 stores the electrical energy supplied by a power supply. After energy charging is completed, an energy transfer stage is performed.

In the energy transfer stage, the energy releasing switch element is in an off-state, that is, both terminals of the energy releasing switch element are off. The energy charging circuit 201 uses stored electrical energy to charge the energy transfer circuit 202. Specifically, the electrical energy is transferred to and stored in the energy storage capacitor C2 of the energy transfer circuit 202. Although the energy releasing switch element is in the off-state, the energy releasing switch element has certain parasitic capacitance. In fact, the current from the energy charging circuit 201 forms two loops. For one loop, the current flows through the energy storage capacitor C2 and a floating-ground diode D2 to the ground GND to form the loop. During the charging process of the energy storage capacitor C2, the laser emitting tube LD is in a reverse bias cut-off state, and energy transfer is completed. For the other loop, the current flows through the parasitic capacitance of the energy releasing switch element to the ground GND to form the loop. It can be seen that the two loops no longer pass through the laser diode LD. Therefore, the laser diode does not have "laser light leakage" during the energy transfer stage, that is, the laser diode does not emit light at an unanticipated time, thereby solving the problem of "the laser light leakage." After the energy transfer of the energy storage capacitor C2 is completed, the energy releasing stage is performed.

In the energy releasing stage, the energy releasing switch element is in an on-state. The electrical energy stored in the energy storage capacitor passes through the two terminals of the energy releasing switch element and the laser diode LD and goes back to the second terminal of the energy storage capacitor to form an energy releasing loop to drive the laser diode LD to emit light.

In one embodiment, the energy transfer circuit further includes a boost rectifier diode. An anode of the boost rectifier diode is connected to the energy charging circuit 201, and a cathode of the boost rectifier diode is connected to the first terminal of the energy storage capacitor C2. The boost rectifier diode has a one-way conduction function.

Only the energy charging circuit 201 is allowed to charge the energy storage capacitor C2 during the energy transfer stage, thereby avoiding the backflow of the electrical energy in the energy storage capacitor C2 caused when the potential of the energy storage capacitor C2 is higher than that of the energy charging circuit 201. It can be understood that the boost rectifier diode may be a Schottky diode.

In one or more embodiments, the energy releasing switch element is a transistor. A collector of the transistor is connected to a first terminal of the energy storage capacitor C2. An emitter of the transistor is grounded and connected to an anode of the laser diode LD. A base of the transistor is connected to an output terminal of a first pulse generator. The first pulse generator can send out pulses, such as rectangular pulses. When the rectangular pulses are at a high level, the collector and the emitter of the transistor are controlled to be on therebetween. When the rectangular pulses are at a low level, the collector and the emitter of the transistor are controlled to be off therebetween. The duration of the high level of the rectangular pulses is the on-time of the transistor.

In one or more embodiments, the energy releasing switch element is a transistor. An emitter of the transistor is connected to a terminal of the energy storage capacitor C2. A collector of the transistor is grounded. The collector of the transistor is connected to an anode of the laser diode LD. A base of the transistor is connected to an output terminal of a first pulse generator. The first pulse generator can send out the pulses, such as the rectangular pulses. When the rectangular pulses are at a high level, the collector and the emitter of the transistor are controlled to be off therebetween. When the rectangular pulses are at a low level, the collector and the emitter of the transistor are controlled to be on therebetween. The duration of the low level of the rectangular pulses is the on-time of the transistor.

In one or more embodiments, the energy releasing switch element is a GaN switch tube. The GaN switch tube is a MOS (Metal Oxide Semiconductor) tube. A drain of the GaN switch tube is connected to the first terminal of the energy storage capacitor C2. A source of the GaN switch tube is grounded, and the source of the GaN switch tube is connected to an anode of the laser diode. A gate of the GaN switch tube is connected to the output terminal of the first pulse generator. The first pulse generator can send the pulses, such as the rectangular pulses, to control the on or off between the collector and the emitter of the GaN switch tube. The duration of the rectangular pulses is the on-time of the GaN switch tube.

In one or more embodiments, the energy charging circuit includes a power supply, a decoupling capacitor, an inductor, and an energy charging switch element. The power supply is a DC power supply. A positive terminal of the power supply is connected to a first terminal of the inductor. A second terminal of the inductor is grounded via an energy charging switch element, and a second terminal of the inductor is connected to the first terminal of the energy storage capacitor C2. The decoupling capacitor is configured to eliminate parasitic coupling between the circuits. When the energy charging switch element is in an on-state, the power supply charges the inductor. After the charging is completed, electrical energy is stored in the inductor. The energy charging switch element can be the GaN switch tube, the MOSFET, or the IGBT.

Further, the energy charging switch element is a transistor. A collector of the transistor is connected to the first terminal of the energy storage capacitor C2. An emitter of the transistor is grounded. A base of the transistor is connected to an output terminal of a second pulse generator. The second pulse generator controls the transistor to be in the on-state by outputting a high level, and controls the transistor to be in the off-state by outputting a low level.

The energy charging switch element is a transistor. An emitter of the transistor is connected to the first terminal of the energy storage capacitor C2. A collector of the transistor is grounded. A base of the transistor is connected to an output terminal of a second pulse generator. The second pulse generator controls the transistor to be in the off-state by outputting a high level, and controls the transistor to be in the on-state by outputting a low level.

The energy charging switch element is a GaN switch tube. A drain of the GaN switch tube is connected to the first terminal of the energy storage capacitor C2. A source of the GaN switch tube is grounded. A gate of the GaN switch tube is connected to an output terminal of a second pulse generator. The second pulse generator is configured to control the on-time of the energy charging switch element.

In one or more embodiments, the energy releasing circuit 203 further includes a dynamic compensation capacitor. The dynamic compensation capacitor is connected across the two terminals of the energy releasing switch element, and the dynamic compensation capacitor is connected across the two switch terminals of the energy releasing switch element. The dynamic compensation capacitor can suppress current resonance caused by parasitic parameters of an electric discharge loop of the energy storage capacitor C2, and supplement dynamic impedance when the energy releasing switch element is turned on.

In one or more embodiments, capacitance of the dynamic compensation capacitor is smaller than that of the energy storage capacitor.

In one or more embodiments, the energy storage capacitor C2 can be formed by connecting a plurality of capacitors in parallel to reduce the ESR (Equivalent Series Resistance) of the energy storage capacitor C2. It is understandable that capacitance of the plurality of capacitors may be equal or unequal. Preferably, the capacitance of the plurality of capacitors connected in parallel is equal. The respective capacitors with the same capacitance connected in parallel have better ESR consistency, and the electric discharge of the respective capacitors connected in parallel is more equal, which can better improve the efficiency of the energy storage capacitor.

It is understandable that a ground connection of various elements in FIG. 4a (for example, the floating-ground diode D2, the laser diode LD, and the energy releasing switch element) can be changed and the various elements are connected to a negative terminal of a power supply, which can also achieve the same function as the laser emitting circuit in FIG. 4a. It can be understood that the negative terminal of the power supply can be grounded.

Figure 4B:
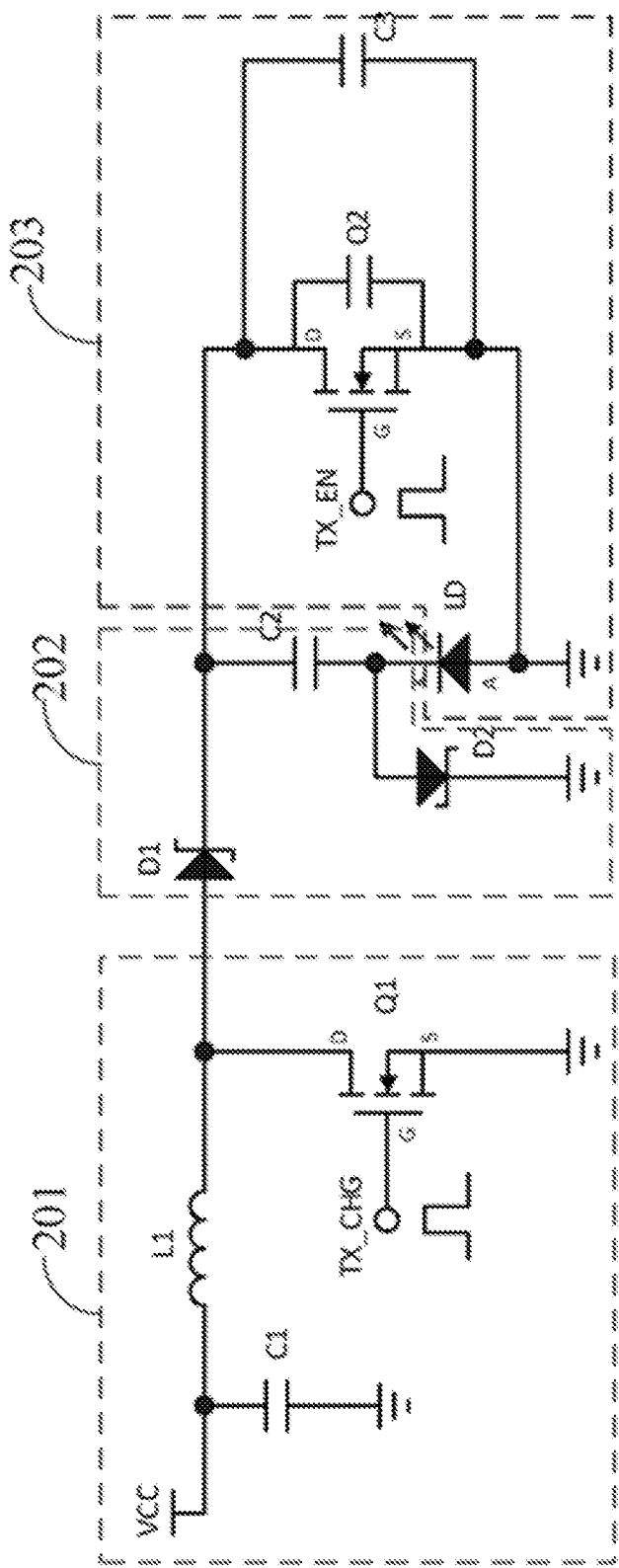
FIG. 4b is another schematic structural diagram of a laser emitting circuit provided by an embodiment of this application.

FIG. 4b is another schematic diagram of a laser emitting circuit provided by an embodiment of this application.

In some embodiments of this application, an energy charging circuit 201 includes a power source VCC, an inductor L1, a decoupling capacitor C1, and an energy charging switch element Q1. The inductor L1 is a first energy storage element. The connection relationship between various elements in the energy charging circuit 201 can refer to FIG. 3, which is not repeated herein.

In some embodiments of this application, the energy releasing circuit 203 includes an energy releasing switch element Q2 and a laser diode LD. The energy charging switch element Q1 can be a transistor or a MOS tube. For example, the transistor can be a PNP transistor or an NPN transistor, and the MOS tube can be an NMOS tube, a PMOS tube, or a GaN switch tube.

A cathode of the laser diode LD is connected to the energy transfer circuit 202, and an anode of the laser diode LD is grounded. A first terminal of the energy releasing switch element Q2 is connected to the energy transfer circuit 202, and a second terminal of the energy releasing switch element Q2 is connected to the anode of the laser diode LD.

Optionally, the energy releasing circuit 203 further includes a dynamic compensation capacitor C3. The dynamic compensation capacitor C3 is connected across the first terminal and the second terminal of the energy releasing switch element.

In some embodiments of this application, the energy transfer circuit 202 includes a capacitor C2 and a bypass diode D2. The capacitor C2 is a second energy storage element. A first terminal of the capacitor C2 is connected to a second terminal of the inductor L1. A second terminal of the capacitor C2 is connected to the cathode of the laser diode LD. An anode of the bypass diode D2 is connected to the cathode of the laser diode LD, and a cathode of the bypass diode D2 is grounded.

Further, the energy transfer circuit 202 further includes a boost rectifier diode D1. An anode of the boost rectifier diode D1 is connected to the second terminal of the inductor L1, and a cathode of the boost rectifier diode D1 is connected to the first terminal of the capacitor C2. The boost rectifier diode D1 has a one-way conduction function, which prevents the capacitor C2 from reversely discharging electricity in the energy transfer stage and the energy releasing stage, causing the electrical energy in the capacitor C2 to flow back and causing the electrical energy in the capacitor C2 to leak. The boost rectifier diode D1 may be a Schottky diode.

The connection relationship of each element in FIG. 4b is as follows: a negative terminal of a power supply VCC is grounded. A positive terminal of the power supply VCC is grounded via the decoupling capacitor C1. A positive terminal of the power supply VCC is also connected to the inductor L1 and a drain (D) of the MOS tube Q1. The drain of the MOS tube Q1 is connected to an anode of the boost rectifier diode D1. A source (S) of the MOS tube Q1 is grounded. A gate (G) of the MOS tube Q1 is connected to an output terminal of a pulse generator TX_CHG.

A cathode of the boost rectifier diode D1 is connected to a first terminal of the energy storage capacitor C2, and the cathode of the boost rectifier diode D2 is also connected to the drain (D) of the MOS tube Q2. A second terminal of the energy storage capacitor C2 is connected to an anode of the floating-ground diode D2, and a cathode of the floating-ground diode D2 is grounded. A second terminal of the energy storage capacitor C2 is connected to a cathode (K) of the laser diode LD. An anode (A) of the laser diode LD is grounded. The anode of the laser diode LD is connected to a source (S) of the MOS tube Q2. A gate (G) of the MOS tube Q2 is connected to the output terminal of the pulse generator TX_EN. The dynamic compensation capacitor C3 is connected across the source and the drain of the MOS tube Q2.

It is understandable that a ground connection of various elements in FIG. 4b (for example, the decoupling capacitor C1, the MOS tube Q1, the floating-ground diode D2, the laser diode LD, and the MOS tube Q2) can be changed and the various elements are connected to a negative terminal of a power supply, which can also achieve the same function as the laser emitting circuit in FIG. 4b. It can be understood that a negative terminal of the power supply may be grounded.

Capacitance of the dynamic compensation capacitor C3 is less than that of the energy storage capacitor C2, and the capacitance of the dynamic compensation capacitor C3 can range from 2 pF to 10 nF. For example, the capacitance of the dynamic compensation capacitor C3 is 100 pF. Capacitance of the energy storage capacitor C2 can range from 2 pF to 20 nF. For example, the capacitance of the energy storage capacitor C2 is 2 nF. An inductance of the inductor L1 can range from 10 nH to 100 pH. For example, the inductance of the inductor L1 is 330 nH. A value range of the parameter value of the forgoing elements is only for reference, and an embodiment of the present application is not limited thereto.

The energy charging switch element Q1 and the energy releasing switch element Q2 in FIG. 4b can be MOS tubes. The working process of the laser emitting circuit is described below:

1. The Energy Charging Stage

The energy charging stage process can be referred to the description of the energy charging stage associated with FIG. 3.

The pulse generator TX_CHG sends rectangular pulses to the gate of the MOS tube Q1 to control the MOS tube Q1 to be in an on-state. The MOS tube Q2 is in an off-state at this time. The power supply VCC charges the inductor. The decoupling capacitor C1 is connected in parallel between positive and negative terminals of the power supply VCC to prevent the circuit from causing parasitic oscillation via a positive feedback path formed by the power supply VCC. The so-called decoupling is to prevent current fluctuations formed in a power supply circuit from affecting the normal operation of the circuit when the currents of front and rear circuits change. In other words, the decoupling circuit can effectively eliminate parasitic coupling between circuits.

2. The Energy Transfer Stage

After energy charging is completed, a pulse generator TX_CHG stops sending rectangular pulses to the MOS tube Q1. The MOS tube Q1 is in an off-state, and the MOS tube Q2 is still in an off-state at this time. Because the current of the inductor L1 cannot change suddenly, at this time, the inductor L1 continues the energy transfer current generated by ΔI, and the energy transfer current is divided into two paths after flowing through the boost rectifier diode D1. One path of the energy transfer current flows through the capacitor C2 and the bypass diode D2 to the ground to form a loop. In this loop, the energy charging current charges the capacitor C2. The laser diode LD is in a reverse-biased state due to the bypass diode D2. Therefore, the laser diode LD does not emit light. The other path of the energy charging current flows through the parasitic capacitance $C_{Q2\text{-}DS}$ (not shown in the figure) of the MOS tube Q2 to the ground to form another loop in which the energy charging current does not flow through the laser diode LD. Therefore, the laser diode LD does not emit light. Obviously, neither of the forgoing two paths of energy transfer currents flows through the laser diode LD, and hence the laser diode LD does not emit light at an unanticipated time, thereby solving the problem of laser leakage.

The improved laser emitting circuit has the following characteristics: the laser diode LD is changed from being originally connected to the drain of the MOS tube Q2 to being connected to the second terminal of the energy storage capacitor C2. The second terminal of the energy storage capacitor C2 is hovered by the laser diode LD being grounded, that is, the second terminal of the energy storage capacitor C2 is no longer directly grounded. Therefore, the laser emitting circuit can also be called a "floating-ground circuit for eliminating laser light leakage."

3. The Energy Releasing Stage

The pulse generator TX_EN sends the rectangular pulses to a gate of the MOS tube Q2 to control the MOS tube Q2 to be in the on-state. The MOS tube Q1 is in the off-state at this time. The electrical energy stored in the capacitor C2 passes through the MOS tube Q2, the laser diode LD, and the ground to form an energy releasing (electric discharge) circuit, and drives the laser diode LD to complete laser emission. In addition, the dynamic compensation capacitor C3 also forms its electric discharge loop via a drain and a source of the MOS tube Q2, and releases the electrical energy stored during the energy transfer to prepare for the next cycle of the laser emission.

Figure 5:
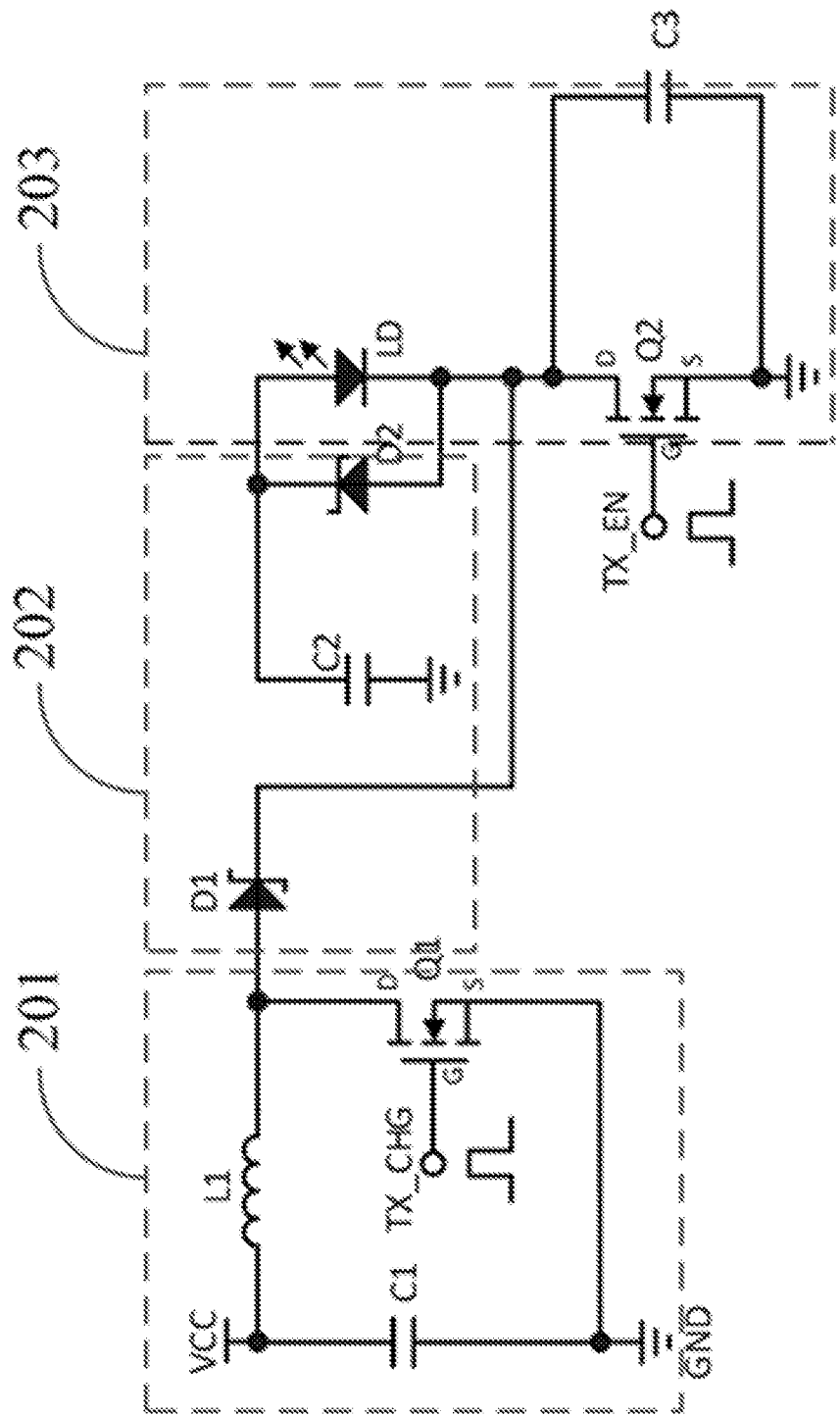
FIG. 5 is another schematic structural diagram of a laser emitting circuit provided by an embodiment of this application.

FIG. 5 is another schematic diagram of a laser emitting circuit provided by an embodiment of this application.

In some embodiments of this application, an energy charging circuit 201 includes a power source VCC, an inductor L1, a decoupling capacitor C1, and an energy charging switch element Q1. The inductor L1 is a first energy storage element. The connection relationship of various elements in the energy charging circuit 201 can be referred to the description of FIG. 3, which is not repeated here.

In some embodiments of this application, an energy releasing circuit 203 includes a laser diode LD and an energy releasing switch element Q2. An anode of the laser diode LD is connected to an energy transfer circuit 202, and a cathode of the laser diode LD is connected to a first terminal of the energy releasing switch element Q2. A second terminal of the energy releasing switch element Q2 is grounded. The energy charging switch element Q1 can be a transistor or a MOS tube. For example, the transistor can be a PNP transistor or an NPN transistor, and the MOS tube can be an NMOS tube, a PMOS tube, or a GaN switch tube.

Optionally, the energy releasing circuit 203 further includes a dynamic compensation capacitor C3. The dynamic compensation capacitor C3 is connected across the first terminal and the second terminal of the energy releasing switch element.

In some embodiments of this application, the energy transfer circuit 202 includes a capacitor C2 and a bypass diode D2. The capacitor C2 is a second energy storage element. A first terminal of the capacitor C2 is connected to an anode of the laser diode LD, and a cathode of the capacitor C2 is grounded. A cathode of the bypass diode D2 is connected to the anode of the laser diode LD, and an anode of the bypass diode D2 is connected to a cathode of the laser diode LD.

Optionally, the energy transfer circuit 202 further includes a boost rectifier diode D1. An anode of the boost rectifier diode D1 is connected to a second terminal of the inductor L1, and a cathode of the boost rectifier diode D1 is connected to the cathode of the laser diode LD. The boost rectifier diode D1 has a one-way conduction function, which prevents the capacitor C2 from reversely discharging electricity in an energy transfer stage and an energy releasing stage, causing the electrical energy in the capacitor C2 to flow back and causing the electrical energy in the capacitor C2 to leak. The boost rectifier diode D1 may be a Schottky diode.

The energy charging switch element Q1 and the energy releasing switch element Q2 in FIG. 5 can be MOS tubes. The working process of the laser emitting circuit includes:

1. The Energy Charging Stage

The energy charging stage process can be referred to the description of the energy charging stage associated with FIG. 3, which is not repeated here.

2. The Energy Transfer Stage

After energy charging is completed, a pulse generator TX_CHG stops sending rectangular pulses to a MOS tube Q1. The MOS tube Q1 is in an off-state, and the MOS tube Q2 is still in an off-state at this time. Because the current of the inductor L1 cannot change suddenly, the inductor L1 continues the energy transfer current generated by ΔI, and the energy transfer current is divided into two paths after flowing through the boost rectifier diode D1. One path of the energy transfer current flows through a bypass diode D2 and the capacitor C2 to the ground to form a loop in which the energy charging current charges the capacitor C2. The laser diode LD is in a reverse-biased state due to the bypass diode D2. Therefore, the laser diode LD does not emit light. The other path of the energy charging current flows through the parasitic capacitance $C_{Q2-DS}$ (not shown in the figure) of the MOS tube Q2 to the ground to form another loop in which the energy charging current does not flow through the laser diode LD. Therefore, the laser diode LD does not emit light. Obviously, neither of the forgoing two paths of energy transfer currents flows through the laser diode LD, and hence the laser diode LD does not emit light at an unanticipated time, thereby solving the problem of laser leakage.

3. The Energy Releasing Stage

The pulse generator TX_EN sends the rectangular pulses to a gate of the MOS tube Q2 to control the MOS tube Q2 to be in an on-state. The MOS tube Q1 is in the off-state at this time. The electrical energy stored in the capacitor C2 flows through the laser diode LD and the MOS tube Q2 to form an energy releasing (electric discharge) loop, and drive the laser diode LD to complete the laser emission. In addition, the dynamic compensation capacitor C3 also forms its electric discharge loop via a drain and a source of the MOS tube Q2, and releases the electrical energy stored during the energy transfer to prepare for the next cycle of the laser emission.

Figure 6:
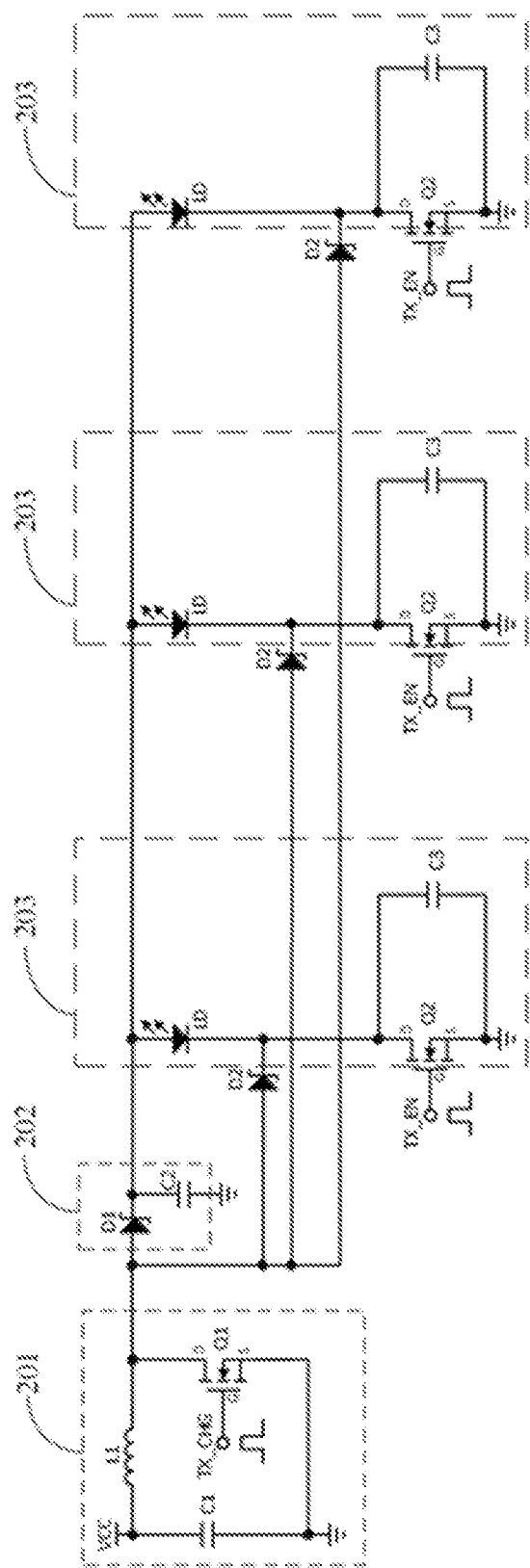
FIG. 6 is another schematic structural diagram of a laser emitting circuit provided by an embodiment of this application.

FIG. 6 is another schematic diagram of a laser emitting circuit provided by an embodiment of this application.

In some embodiments of this application, one energy transfer circuit 202 is provided, and a plurality of energy releasing circuits 203 are provided, that is, the energy transfer circuit 202 and the energy releasing circuit 203 have a one-to-multiple relationship. The plurality of energy releasing circuits 203 are connected in parallel. A plurality of bypass diodes D2 in the energy transfer circuit 202 are provided. The number of bypass diodes D2 is equal to that of the energy releasing circuits 203, that is, each energy releasing circuit 203 is provided with one bypass diode D2. In some embodiments, the plurality of energy releasing circuits 203 can also share one bypass diode D2. In FIG. 6, one energy transfer circuit 202 corresponds to three energy releasing circuits 203, for illustration purpose.

The connection relationship and working principle of various elements in the energy charging circuit 201, the energy transfer circuit 202 and the energy releasing circuit 203 in FIG. 6 can be referred to in FIG. 3, which are not repeated here.

Figure 7:
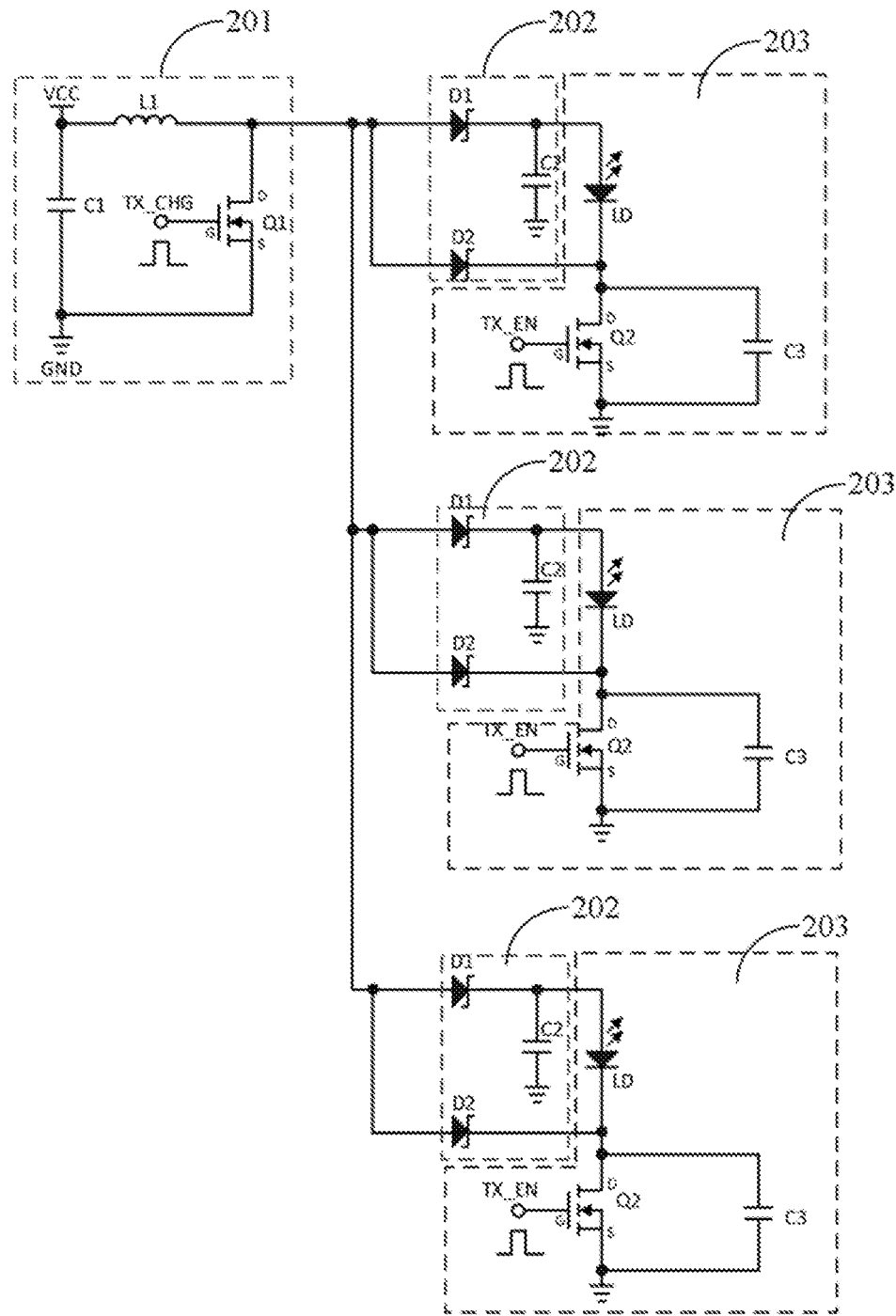
FIG. 7 is another schematic structural diagram of a laser emitting circuit provided by an embodiment of this application.

FIG. 7 is another schematic diagram of a laser emitting circuit provided by an embodiment of this application.

In some embodiments of this application, a plurality of energy transfer circuits 202 and a plurality of energy releasing circuits 203 are provided. The number of the energy transfer circuits 202 is equal to that of the energy releasing circuits 203, that is, the energy transfer circuits 202 and the energy releasing circuits 203 have a one-to-one relationship. One energy transfer circuit 202 and one energy releasing circuit 203 form one circuit unit. Circuit units are connected in parallel. The laser emitting circuit in FIG. 7 includes three circuit units, and each circuit unit includes one energy transfer circuit 202 and one energy releasing circuit 203.

The connection relationship and working principle of various elements in the energy charging circuit 201, the energy transfer circuit 202, and the energy releasing circuit 203 in FIG. 7 can be referred to in FIG. 3, which are not repeated here.

It should be noted that in embodiments of FIGS. 3 to 7, a decoupling capacitor C1 is connected in parallel between positive and negative terminals of a power supply VCC to be able to prevent the circuit from causing parasitic oscillation via a positive feedback path formed by the power supply VCC. The so-called decoupling is to prevent current fluctuations formed in a power supply circuit from affecting the normal operation of the circuit when the currents of front and rear circuits change. In other words, a decoupling circuit can effectively eliminate parasitic coupling between the circuits.

It should be noted that in the embodiments of FIGS. 3 to 7, an energy charging switch element Q1 or an energy releasing switch element Q2 can be a transistor. A collector of the transistor is a first terminal of the energy charging switch element Q1 or the energy releasing switch element Q2. An emitter of the transistor is a second terminal. A base of the transistor is an enable terminal. The base of the transistor is connected to an output terminal of a first pulse generator. The first pulse generator controls the transistor to be in an on-state by outputting a high electrical level, and controls the transistor to be in an off-state by outputting a low electrical level.

It should be noted that in embodiments of FIGS. 3-7, an energy charging switch element Q1 or an energy releasing switch element Q2 can be a transistor. The emitter of the transistor is the first terminal of the energy charging switch element Q1 or the energy releasing switch element Q2. The collector of the transistor is a second terminal of the energy charging switch element Q1 or the energy releasing switch element Q2. The base of the transistor is the enable terminal and connected to the output terminal of the first pulse generator. The first pulse generator controls the transistor to be in the off-state by outputting the high electrical level, and controls the transistor to be in the on-state by outputting the low electrical level.

It should be noted that in the embodiments of FIGS. 3-7, the energy charging switch element Q1 or the energy releasing switch element Q2 can be a MOS tube. A drain of the MOS tube is a first terminal, and a GaN switch tube is a second terminal. A gate of the GaN switch tube is the enable terminal, which is connected to the output terminal of the first pulse generator. The first pulse generator is configured to control the on-time of the MOS tube.

It should be noted that the energy charging switch element Q1 or the energy releasing switch element Q2 can be a MOS tube. A source of the MOS tube is a first terminal, and a drain of the MOS tube is a second terminal. A gate of the MOS tube is the enable terminal, which is connected to the output terminal of the first pulse generator. The first pulse generator is configured to control the on-time of the MOS tube.

It should be noted that in the embodiments of FIGS. 3-7, a dynamic compensation capacitor C3 can suppress current resonance caused by parasitic parameters of an electric discharge loop of a capacitor C2, and supplement dynamic impedance when the energy releasing switch element Q2 is turned on. Optionally, capacitance of the dynamic compensation capacitor C3 is smaller than that of the capacitor C2. Optionally, the capacitor C2 can be formed by connecting the plurality of capacitors in parallel to reduce the ESR (Equivalent Series Resistance) of the capacitor C2. It is understandable that the capacitance values of the plurality of capacitors may be equal or unequal. Preferably, the capacitance values of the plurality of capacitors connected in parallel are equal. The respective capacitors with the same capacitance connected in parallel have better ESR consistency, and the electric discharge of the respective capacitors connected in parallel is more consistent, which can better improve the efficiency of the energy storage element.

It is understandable that in the embodiments of FIG. 3-7, a ground connection of various elements in the laser emitting circuit (for example, a bypass diode D2, a laser diode LD, and the energy releasing switch element) can be changed so that the various elements are connected to a negative terminal of a power supply, which can also achieve the same function as the laser emitting circuit in FIGS. 3-7.

An embodiment of this application further provides a LiDAR, including a laser emitting circuit described above.

Specifically, the forgoing laser emitting circuit can be applied to the LiDAR. In addition to the laser emitting circuit, the LiDAR can also include specific structures such as a power supply, a processing device, an optical receiving apparatus, a rotating body, a base, a housing, and a human-computer interaction apparatus. It is understandable that the LiDAR can be a single-channel LiDAR, and includes one channel of the forgoing laser emitting circuit. The LiDAR can also be a multi-channel LiDAR, and includes a plurality of channels of the forgoing laser emitting circuits and a corresponding control system. The quantity of the laser emitting circuits can be determined according to actual needs.

For the forgoing LiDAR, the structure of the laser emitting circuit is changed so that for the laser emitting circuit in an energy transfer stage, the energy transfer current from an energy storage element does not pass through a laser diode, and the laser diode is in a reverse-biased state relative to the energy transfer current. Therefore, the parasitic capacitance of an energy releasing switch element does not cause the laser diode to emit light in advance during an energy transfer charging process, which prevents the laser diode from emitting light at an unanticipated time, thereby solving the problem of laser leakage.

For the forgoing LiDAR, a laser diode is changed from being originally connected to a drain of MOS tube Q2 to being connected to a second terminal of an energy storage capacitor C2. The second terminal of the energy storage capacitor C2 is grounded via a cathode of the laser diode LD. The second terminal of the energy storage capacitor C2 is hovered via the laser diode LD, that is, the second terminal of the energy storage capacitor C2 is no longer directly grounded. In an energy transfer stage, parasitic capacitance of an energy releasing switch element does not cause the laser diode to emit light in advance during an energy transfer charging process, thereby avoiding the laser diode from emitting light at an unanticipated time, and solving the problem of laser light leakage.

The person skilled in the art can understand that all or part of the procedures in methods of the forgoing embodiments can be implemented by instructing relevant hardware via a computer program. The program can be stored in a computer readable storage medium. During execution, the computer program can include the procedures of the embodiments of the forgoing methods. A storage medium can be a magnetic disk, an optical disc, a read-only storage memory, a random storage memory, etc.

The forgoing descriptions are only preferred embodiments of this application, which of course cannot be used to limit the scope of this application. Therefore, equivalent changes made in accordance with the claims of this application still fall within the scope of the application.

What is claimed is:

1. A laser emitting circuit, comprising:
an energy charging circuit, comprising a power supply, a first energy storage element, and an energy charging switch element, wherein a negative terminal of the power supply is grounded, a positive terminal of the power supply is connected to a first terminal of the first energy storage element, a second terminal of the first energy storage element is connected to a first terminal of the energy charging switch element, and the second terminal of the energy charging switch element is grounded, and the energy charging circuit being configured to, in an energy charging stage when the energy charging switch element is in an on-state, charge the first energy storage element using energy charging current from the power supply;
an energy transfer circuit, connected to the second terminal of the first energy storage element and connected between the energy charging circuit and an energy releasing circuit, the energy transfer circuit comprising a second energy storage element and a boost rectifier diode, wherein the boost rectifier diode is respectively connected between the first energy storage element and the second energy storage element, the energy transfer circuit is configured to, in an energy transfer stage, charge the second energy storage element using energy transfer current from the first energy storage element; and
the energy releasing circuit, connected to the energy transfer circuit, the energy releasing circuit comprising a laser diode and an energy releasing switch element, wherein the laser diode is connected between the second energy storage element and the the first terminal of the energy releasing switch, a cathode of the laser diode is connected to a first terminal of the energy releasing switch element, a second terminal of the energy releasing switch element connected to ground, when the energy releasing switch element is in an on-state, and the energy charging switch element is in an off-state, electrical energy stored in the second energy storage element flows through the laser diode and the energy releasing switch element to form an energy releasing loop, and drive the laser diode to emit light;
wherein the energy transfer circuit further comprises a bypass diode configured to make the energy transfer current maintain a reverse-biased state for the laser diode in the energy transfer stage, the laser emitting circuit satisfies one of the following conditions a and b:
a) an anode of the bypass diode is connected to the anode of the boost rectifier diode, and a cathode of the bypass diode is connected to the cathode of the laser diode; or
b) the bypass diode is connected between the boost rectifier diode and the second energy storage element, the anode of the bypass diode is connected to the cathode of the laser diode, and the cathode of the bypass diode is connected to the
anode of the laser diode; and
wherein the energy releasing switch element is a metal oxide semiconductor (MOS) tube, and a drain and a source of the MOS tube are the first terminal and the second terminal of the energy releasing switch element respectively, a dynamic compensation capacitor forms an electric discharge loop via the drain and the source of the MOS tube, and releases electrical energy stored during an energy transfer for a next cycle of laser emission.

2. The laser emitting circuit according to claim 1, wherein the energy charging circuit comprises the power supply, a decoupling capacitor, an inductor, and the energy charging switch element;
wherein the first energy storage element is the inductor;
wherein the energy charging switch element is provided with the first terminal, an enable terminal, and the second terminal; and
wherein the positive terminal of the power supply is grounded via the decoupling capacitor.

3. The laser emitting circuit according to claim 2, wherein the energy releasing switch element is provided with the first terminal, an enable terminal, and the second terminal; and
wherein the anode of the laser diode is connected to the energy transfer circuit, the cathode of the laser diode is connected to the first terminal of the energy releasing switch element, and the second terminal of the energy releasing switch element is grounded.

4. The laser emitting circuit according to claim 3,
wherein the second energy storage element is a capacitor;
wherein a first terminal of the second energy storage element is connected to the second terminal of the first energy storage element, and the first terminal of the second energy storage element is connected to the anode of the laser diode;
wherein the second terminal of the second energy storage element is grounded; and
wherein an anode of the bypass diode is connected to the second terminal of the first energy storage element, and a cathode of the bypass diode is connected to the first terminal of the energy releasing switch element.

5. The laser emitting circuit according to claim 4,
wherein an anode of the boost rectifier diode is connected to the second terminal of the first energy storage element, the anode of the boost rectifier diode is connected to the anode of the bypass diode, and a cathode of the boost rectifier diode is grounded via the second energy storage element.

6. The laser emitting circuit according to claim 3,
wherein the second energy storage element is a capacitor; and
wherein the first terminal of the second energy storage element is connected to the anode of the laser diode, and the second terminal of the second energy storage element is grounded.

7. The laser emitting circuit according to claim 6, an anode of the boost rectifier diode is connected to the second terminal of the first energy storage element, and a cathode of the boost rectifier diode is connected to the cathode of the laser diode.

* * * * *